（12）United States Patent
Yang et al.

(10) Patent No.: US 12,490,535 B2
(45) Date of Patent: Dec. 2, 2025

(54) CMOS IMAGE SENSOR AND METHOD FOR MAKING THE SAME

(71) Applicant: TAIWAN SEMICONDUCTOR MANUFACTURING COMPANY, LTD., Hsinchu (TW)

(72) Inventors: Ming-Hsien Yang, Hsinchu (TW); Wei-Chih Weng, Hsinchu (TW); Chun-Wei Chia, Hsinchu (TW); Chun-Hao Chou, Hsinchu (TW); Tse Yu Tu, Hsinchu (TW); Chien Nan Tu, Hsinchu (TW); Chun-Liang Lu, Hsinchu (TW); Kuo-Cheng Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 414 days.

(21) Appl. No.: 18/137,291

(22) Filed: Apr. 20, 2023

(65) Prior Publication Data

US 2024/0355847 A1    Oct. 24, 2024

Related U.S. Application Data

(60) Provisional application No. 63/427,736, filed on Nov. 23, 2022.

(51) Int. Cl.
*H01L 27/146* (2006.01)
*H10F 39/00* (2025.01)
*H10F 39/18* (2025.01)

(52) U.S. Cl.
CPC ....... *H10F 39/8053* (2025.01); *H10F 39/024* (2025.01); *H10F 39/182* (2025.01); *H10F 39/8063* (2025.01); *H10F 39/807* (2025.01)

(58) Field of Classification Search
CPC .. H10F 39/8053; H10F 39/024; H10F 39/182; H10F 39/8063; H10F 39/807;
(Continued)

(56) References Cited

U.S. PATENT DOCUMENTS 8,970,768 B2 * 3/2015 Ahn .................... H10F 39/8067
348/340
10,686,000 B1 6/2020 Lin et al.
(Continued)

FOREIGN PATENT DOCUMENTS

| TW | 1699007 B | 7/2020 |
|---|---|---|
| TW | 202123442 A | 6/2021 |
| TW | 202215653 A | 4/2022 |

*Primary Examiner* — Leonardo Andujar
(74) *Attorney, Agent, or Firm* — STUDEBAKER BRACKETT PLLC

(57) ABSTRACT

A CMOS image sensor includes a unit pixel array including a photodiode array, a color filter array, a micro-lens array, and a grid isolation structure laterally separating adjacent color filters. The grid isolation structure includes a first low-n grid, a second low-n grid underlying the first low-n grid, and a metal grid within the second low-n grid, the first low-n grid being narrower than the second low-n grid. The color filter array includes color filter matrixes, all color filter matrixes have the same arrangement pattern. Sizes of color filters in each color filter matrix vary depending on locations of the color filters in the color filter matrix. In an edge portion, a distance between a center of a color filter matrix and a center of a corresponding unit pixel matrix in plan view varies depending on a location of the unit pixel matrix in the CMOS image sensor.

20 Claims, 18 Drawing Sheets

(58) Field of Classification Search
CPC ...... H10F 39/199; H10F 39/18; H10F 39/192; H10F 39/8027; H10F 39/011; H10K 30/80; H10K 30/81; H10K 30/88; H10K 39/32; Y02E 10/549
See application file for complete search history.

(56) References Cited

U.S. PATENT DOCUMENTS

| | | | |
|---|---|---|---|
| 2012/0268631 A1* | 10/2012 | Takase | H10F 39/8063 257/E31.127 |
| 2017/0170220 A1* | 6/2017 | Nam | H10F 39/8053 |
| 2021/0074751 A1 | 3/2021 | Bonakdar et al. | |
| 2022/0115421 A1 | 4/2022 | Huang et al. | |
| 2022/0139993 A1 | 5/2022 | Kim et al. | |

* cited by examiner

CMOS IMAGE SENSOR AND METHOD FOR MAKING THE SAME

PRIORITY CLAIM AND CROSS-REFERENCE

This application claims priority to U.S. Provisional Application No. 63/427,736 filed on Nov. 23, 2022, entitled "CMOS Image Sensor and Method for Making the Same," the entire disclosure of which is incorporated herein by reference.

BACKGROUND

As the semiconductor industry has progressed into nanometer technology process nodes in pursuit of higher device density, greater performance, and lower costs, challenges for both design and fabrication of integrated circuits have greatly increased. Nowadays, CMOS image sensors are widely used. However, due to continually reduced pixel sizes in pursuit of increased resolution, CMOS image sensors may face challenges or risks such as inadequate quantum efficiency (QE) and non-uniformed pixel performance. Techniques for improving performances of the CMOS image sensors are therefore desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
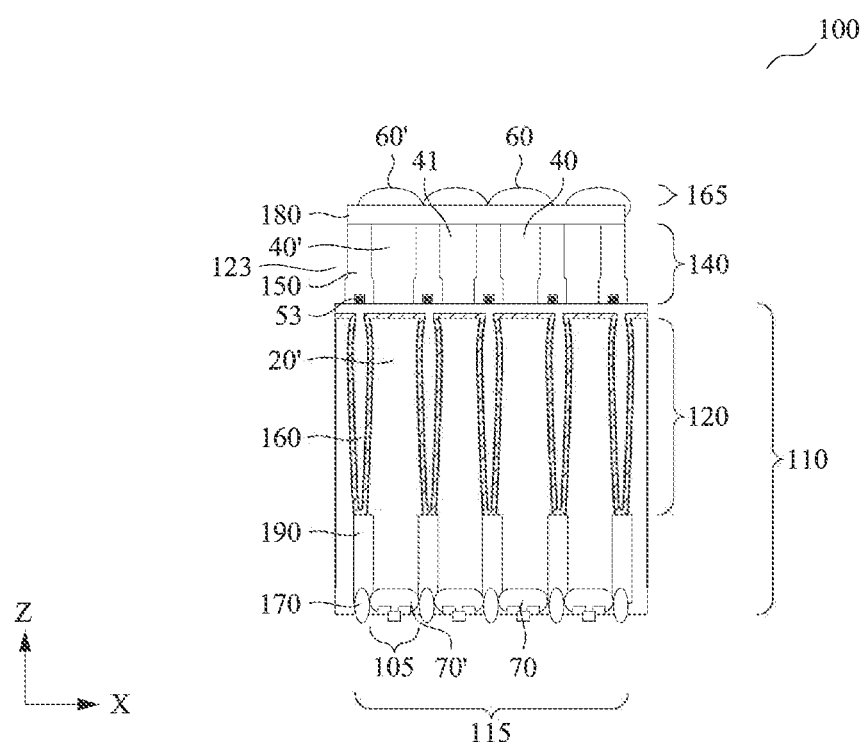
FIG. 1A illustrates a cross sectional view of a CMOS image sensor (CIS) including pixel image sensors in accordance with an embodiment.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

With technical developments in integrated circuit (IC) and semiconductor industries, sizes or pitches of pixel image sensors of the CMOS image sensors (CISs) are greatly reduced to increase image resolution and reduce costs. However, as sizes of CIS pixel image sensors continue to decrease to a level close to or within a visible light wavelength range, there is an issue or risk of reduced quantum efficiency (QE) and poor performance uniformity on the pixel image sensors especially at edge portions of the CMOS image sensors.

The present disclosure generally relates to a CMOS image sensor including a photodiode array formed in a semiconductor substrate, a color filter array over the photodiode array, a micro-lens array over the color filter array, and a composite grid isolation structure laterally separating adjacent color filters in the color filter array. The CMOS image sensor may include an entire color filter array that includes a plurality of color filter matrixes, all having the same arrangement pattern and each including 2×2 color filter units of three different colors. Each color filter unit includes a predetermined number (such as 1, 2×2, 3×3, 4×4) of color filter cells of the same color.

More particularly, a composite grid insolation structure is provided to laterally separate adjacent color filters of a color filter array in a color filter layer of a CMOS image sensor. The composite grid isolation structure includes a first low refractive index (low-n) grid, a second low-n grid underlying the first low-n grid, and a metal grid within the second low-n grid, the first low-n grid being narrower than the second low-n grid.

In addition, sizes of color filters in each color filter matrix may vary depending on locations of the color filters in the color filter matrix. The shifts of color filters within a color filter matrix can be referred to as "inner shifts" hereinafter.

Furthermore, in edge portions beyond a center region of the color filter array, color filter matrixes may shift relative to corresponding underneath photodiodes by some shift amount depending on locations of the color filter matrixes in the entire color filter array. For example, in an edge region, color filter matrixes may shift by a gradually increased shift amount in a direction from a center of the center region to an edge of the edge region. The shifts of color filter matrixes in the entire color filter array of the CMOS image sensor are referred to as "global shifts" hereinafter.

Advantageously, quantum efficiency (QE) and performance uniformity of the pixel image sensors in the CMOS image sensor are improved as a result of the composite grid insolation structure, as well as the arrangements and adjustments (e.g., by global or inner shifts) of the color filter matrixes and the color filter cells within the color filter matrixes.

Figure 1B:
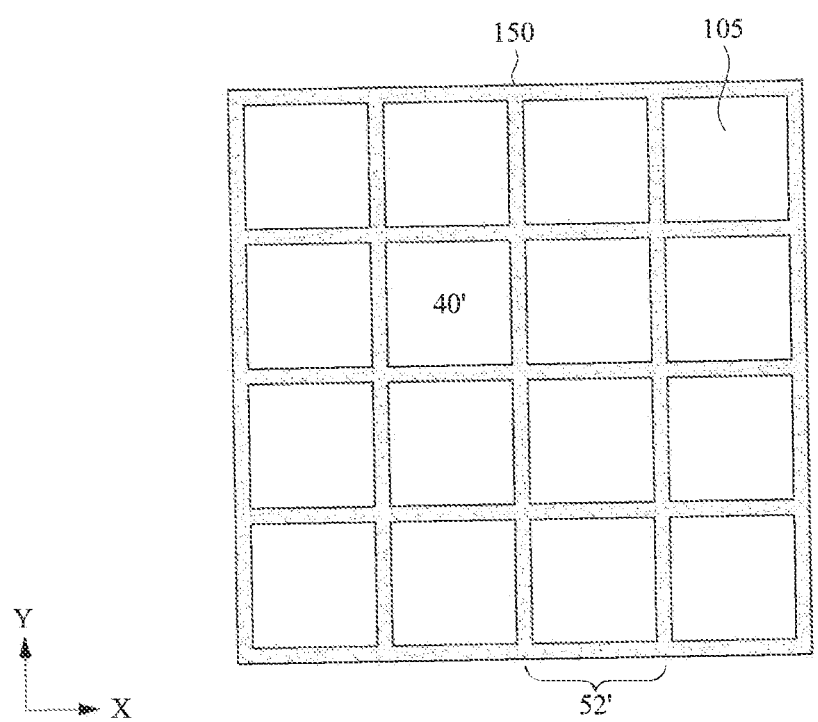
FIG. 1B illustrate a plan (layout) view of pixels defined by a first isolation structure in accordance with an embodiment.
Figure 3:
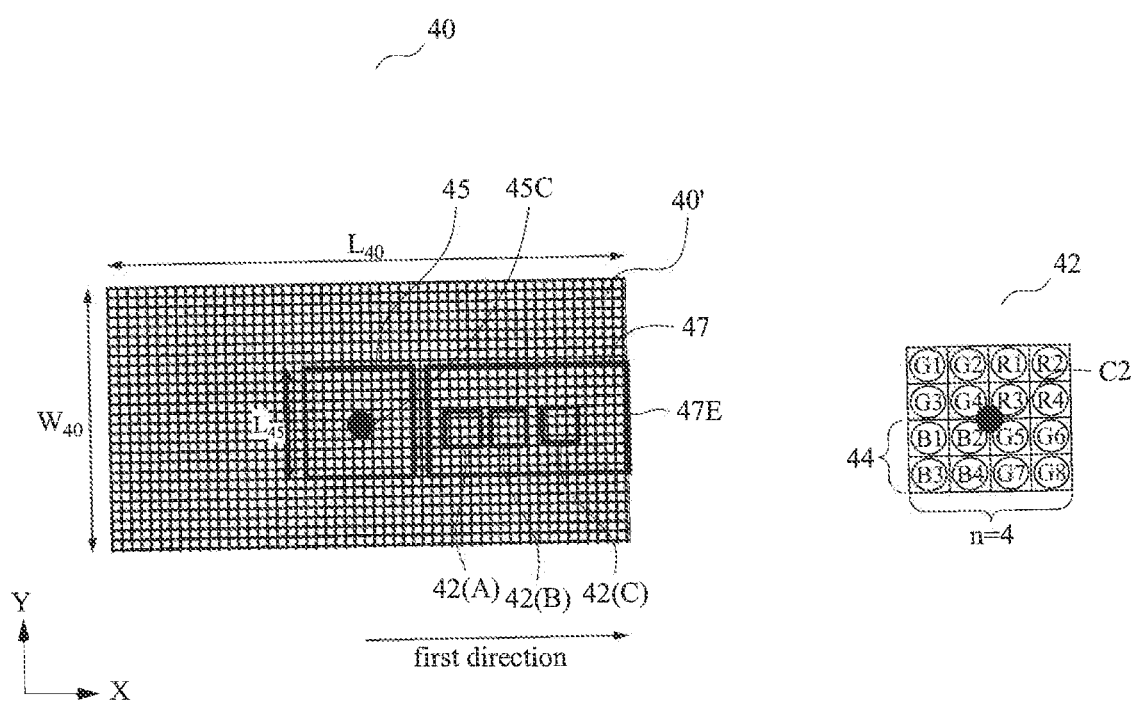
FIG. 3 illustrates a top plan view of an array of color filters of pixel sensors of a CMOS image sensor in accordance with an embodiment.

FIG. 1A illustrates a cross sectional view of a CMOS image sensor 100 including pixel image sensors and FIG. 1B shows a part of pixels of the CMOS image sensor 100 in accordance with an embodiment. In some embodiments, the CMOS image sensor 100 includes a photodiode layer 120 including a photodiode array 20 disposed in a semiconductor substrate 110, a color filter layer 140 including a color filter array 40 (with more details as shown in FIG. 3) disposed over and substantially aligning with the photodiode array 20, and a micro-lens layer 165 including a micro-lens array 60 disposed over and aligning with the color filter array 40.

The CMOS image sensor 100 also includes a first isolation structure 150 (more structural details are shown in FIGS. 2A-2E) disposed in the color filter layer 140 to laterally separate adjacent col-or filter cells (or color filters) 40' of the color filter array 40, and a second isolation structure 160 disposed in the semiconductor substrate 110 to laterally separate adjacent photodiodes 20' of the photodiode array 20 in the photodiode layer 120.

As shown in FIG. 1B, each pixel is defined by an array of grid segments 52' of the first and second isolation structures. The array of grid segments 52' each also defines a space or room for a color filter 40'. The shapes of the grid segments 52' (pixel shape) of a CMOS image sensor 100 are square in some embodiments, and are rectangular in other embodiments. Accordingly, a plurality of grid segments of the first and/or second isolation structures as "walls" define spaces for color filters 40' in the color filter layer 140.

In some embodiments, the grid includes the metal grid 53 of the first isolation structure 150 that defines spaces or sizes and locations of the color filters 40' of the color filter array 40 in the color filter layer 140 as shown in FIG. 1A.

The substrate 110 may include a single crystalline semiconductor material such as, but not limited to Si.

In some embodiments, the CMOS image sensor 100 includes a separation layer 180 that vertically spaces the micro-lens layer 165 and the color filter layer 140.

In some embodiments, the second isolation structure 160 includes a deep trench isolation (DTI) grid that vertically extends into the substrate 110 from an upper surface of the photodiode layer 120. In some embodiments, the DTI grid 160 substantially aligns with the first isolation structure 150.

In some embodiments, the CMOS image sensor 100 includes a transfer transistor array 70 of the transfer transistors 70' disposed in the semiconductor substrate 110. The CMOS image sensor 100 includes a third isolation structure 170 that laterally separates adjacent transfer transistors 70' of the transfer transistor array 70. Each transfer transistors 70' includes a gate structure, source/drain regions, and a gate dielectric. Source and drain are used interchangeably in this disclosure. In some embodiments, the third isolation structure 170 includes a shallow trench isolation (STI) grid aligned with the DTI grid 160. In some embodiments, the CMOS image sensor 100 also includes ion implantation grid 190 that is disposed between the DTI grid 160 and the STI grid 170 in the semiconductor substrate 110 to laterally separate adjacent photodiodes 20' of the photodiode array 20. In some embodiments, the ion implantation grid 190 substantially aligns with the DTI grid 160 and the STI grid 170.

Referring to FIGS. 1A and 1B, the CMOS image sensor 100 includes a plurality of unit pixels 105. Each unit pixel 105 of the plurality of unit pixels includes a photodiode 20' surrounded by a segment of a second isolation structure (such as a DTI) 160, a color filter 40' of a color (such as red, blue, or green) disposed over the photodiode 20', and a micro-lens 60' disposed over the color filter 40'. The photodiode 20', the color filter 40', and the micro-lens 60' of the unit pixel 105 thus form a light channel. An incident light on a top surface of the unit pixel 105 is focused by the micro-lens 60' onto an effective area of the color filter 40', filtered by the color filter 40' to become a monochromic light beam, and received by the photodiode 20'. The photodiode 20' transforms the intensity of the received incident light into electric signals. A transfer transistor 70' corresponding to photodiode 20' in the unit pixel 105 facilities read-out of the electric signals.

As sizes of unit pixels 105 continue to decrease to be close to or within a visible light wavelength range in pursuit of high resolution, there might be an issue or risk of a reduced quantum efficiency and a non-uniformed pixel performance of the unit pixels 105, especially at edge regions (e.g., right, left, up, and down regions) of the CMOS image sensor 100.

In the present disclosure, a novel isolation structure for a color filter is disclosed.

FIGS. 2A-2D illustrates a cross sectional view of the first isolation structure 150 of a CMOS image sensor in accordance with embodiments. FIG. 2E illustrates a top plan view of the first isolation structure 150 of a CMOS image sensor 100 in accordance with an embodiment. FIGS. 2A-2D are cross sectional views corresponding to line X1-X1 of FIG. 2E. FIG. 2E shows a part corresponding to a cross point of the grid shown in FIG. 1B.

Figures 2A, 2B, 2C, 2D:
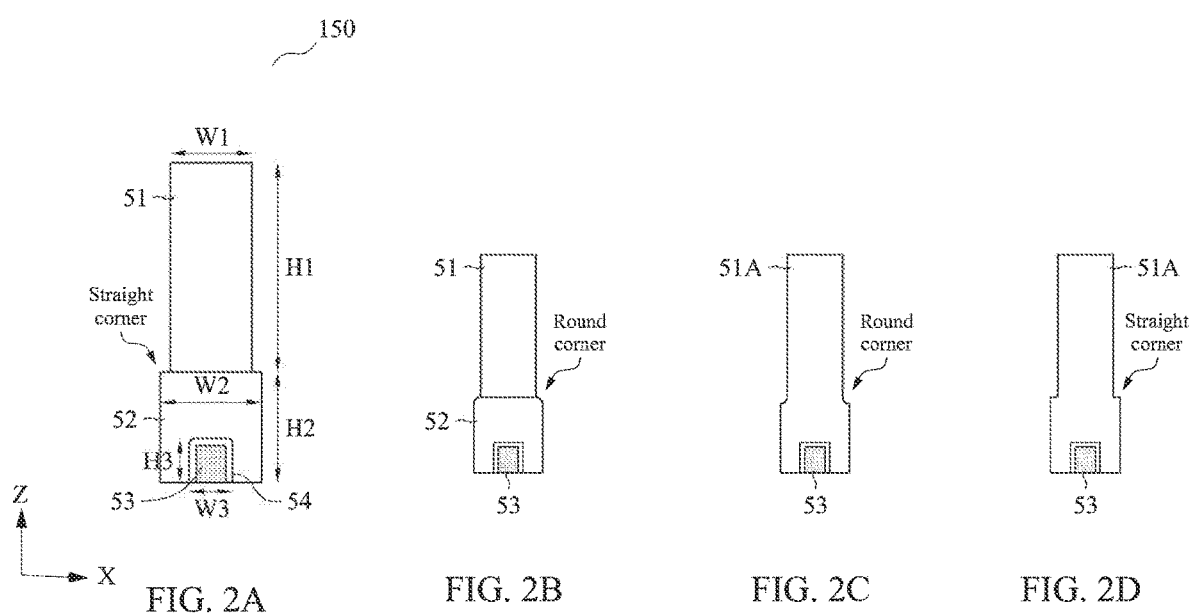
FIGS. 2A, 2B, 2C and 2D illustrate cross sectional views of a first isolation structure of a CMOS image sensor in accordance with embodiments.
Figure 2E:
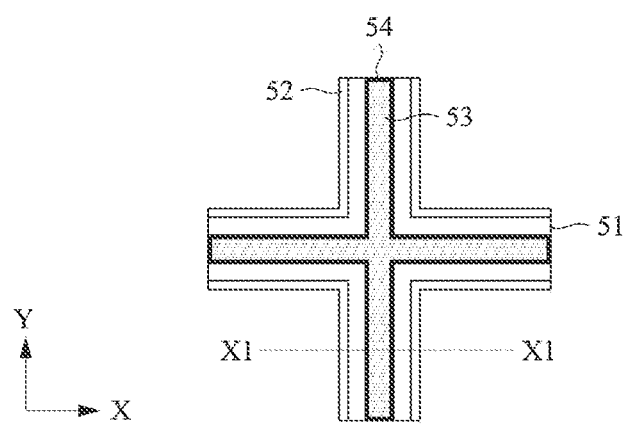
FIG. 2E illustrates a top plan view of the first isolation structure of a CMOS image sensor in accordance with an embodiment.

In accordance with an embodiment, as shown in FIGS. 2A and 2B, the first isolation structure 150 includes a first low refractive index (low-n) dielectric grid 51, a second low-n dielectric grid 52 underlying the first low-n dielectric grid 51, and a metal grid 53 that is at least partially enclosed by the second low-n dielectric grid 52. In some embodiments, the first isolation structure 150 includes an etch stop film 54 at least partially wrapping the metal grid 53 in the second low-n dielectric grid 52, and thus separating the metal grid 53 from the second low-n dielectric grid 52. The etch stop film 54 is made of a dielectric material such as aluminum oxide (e.g., $Al_2O_3$), silicon nitride, hafnium oxide, zirconium oxide or any other suitable material.

In some embodiments, the materials of the second low-n dielectric grid 52 and the first low-n dielectric grid 51 are different from each other, as shown in FIGS. 2A and 2B. In other embodiments, the second low-n dielectric grid 52 and the first low-n dielectric grid 51 are made of the same material 51A as shown in FIGS. 2C and 2D.

In some embodiments, upper corners of the second low-n dielectric grid 52 are substantially straight cornered as shown in FIGS. 2A and 2D. In other embodiments, the upper corners of the second low-n dielectric grid 52 are round cornered as shown in FIGS. 2B and 2C. In some embodiments, a radius of the corner is about 1 nm to about 10 nm.

In some embodiments, the first low-n dielectric grid 51 is made of a dielectric material (such as silicon oxide, e.g., $SiO_2$) or a ceramic material, and the second low-n dielectric grid 52 is made of a dielectric material (such as silicon oxide, e.g., $SiO_2$) or a ceramic material. In some embodiments, the metal grid 53 is made of a metal material (such as W, Al, Cu, or Cr), or a metal alloy material (such as TiN). In some embodiments, the color filters 40' of the color filter array 40 are made of an organic or inorganic dielectric material.

In some embodiments, the refractive index n1 of the first low-n dielectric grid 51 is in a range from a value greater than 1 (e.g., 1.01) to about 1.50, that is 1<n1<1.50. In some embodiments, the refractive index n2 of the second low-n dielectric grid 52 is in a range from a value greater than 1 (e.g., 1.01) to about 1.50, that is 1<n2<1.50. In some embodiments, the refractive index n1 of the first low-n dielectric grid 51 is equal to or greater than the refractive index n2 of the second low-n dielectric grid 52, that is n1=n2, or n1>n2.

In some embodiments, both the refractive index n1 of the first low-n dielectric grid 51 and the refractive index n2 of the second low-n dielectric grid 52 of the first isolation structure 150 are less than the refractive index n of the color filters 40' of the color filter array 40, that is n1<n and n2<n. In this way, total internal reflection in the color filters of the pixel image sensor array can be enhanced, and the quantum efficiency (QE) of the pixel image sensor array can thus be improved.

In some embodiments, a first width W1 of the first low-n dielectric grid 51 is in a range from about 50 nm to about 200 nm, and a first height H1 of the first low-n dielectric grid 51 is in a range from about 100 nm to about 1000 nm. In some embodiments, a second width W2 of the second low-n dielectric grid 52 is in a range from about 90 nm to about 300 nm, and a second height H2 of the second low-n dielectric grid 52 is in a range from about 100 nm to about 1000 nm. In some embodiments, a third width W3 of the metal grid 53 is in a range from about 20 nm to about 80 nm, and a third height H3 of the metal grid 53 is in a range from about 30 nm to about 500 nm.

In some embodiments, a first width W1 of the first low-n dielectric grid 51 is less than a second width W2 of the second low-n dielectric grid 52. In some embodiments, a ratio of W1 to W2 (W1/W2) is in a range from about 0.2 to about 0.8 in some embodiments. In some embodiments, a first height H1 of the first low-n dielectric grid 51 is greater than a second height H2 of the second low-n dielectric grid 52. In some embodiments, a ratio of H1 to H2 (H1/H2) is in a range from about 1.2 to about 10 in some embodiments. In this way, a space or a room of each color filter 40' of the color filter array 40 of the CMOS image sensor 100 can be enlarged, and the quantum efficiency (QE) of each unit pixel of the pixel image sensor array can thus be enhanced.

FIG. 3 illustrates a top plan view of a color filter array 40 of pixel sensors of a CMOS image sensor 100 in accordance with an embodiment. The color filter array 40 includes a center region 45, and edge regions (such as the right edge region 47) beyond the center region 45. For example, the color filter array 40 can be rectangular-shaped with a length L40 and a width W40 (L40>W40) and centered at a center point 45C, and the center region 45 can be square-shaped with an edge length Las and also centered at the center point 45C. In some embodiments, a ratio of the edge length L45 of the center region 45C and the width W40 of the color filter array 40 is defined to be in a range from about 0.3 to about 0.8. Any regions, such as the right region 47 beyond the center region 45 as shown in FIG. 3, are defined as edge regions.

In some embodiments, the color filter array 40 includes a plurality of color filter cells (or color filters) 40'. Color filter cells and color filters are interchangeably used hereinafter. The plurality of color filters 40' are formed and horizontally arranged into a plurality of color filter matrixes 42. Each color filter matrix 42 of the color filter array 40 has the same horizontal arrangement pattern in plan. In some embodiments, each of the color filter matrixes 42 includes an n×n square matrix of color filters defined by the first isolation structure 150, where n=an even integer (e.g., n=4). There is an n×n square matrix of photodiodes under the color filter matrix 42. In some embodiments, the color filter matrix is defined by the first isolation structure 150, of which boundary is shared by the adjacent matrixes. In some embodiments, the color filter matrix corresponds to a photodiode matrix which is defined by the second isolation structure 160, of which boundary is shared by the adjacent matrixes.

Figure 4A:
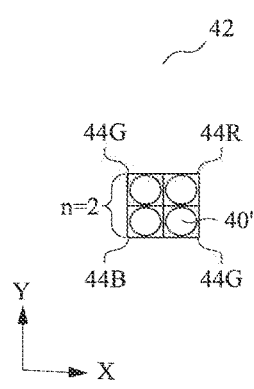
FIGS. 4A, 4B and 4C illustrate top plan views of various color filter matrixes of a color filter array in accordance with embodiments.
Figure 4B:
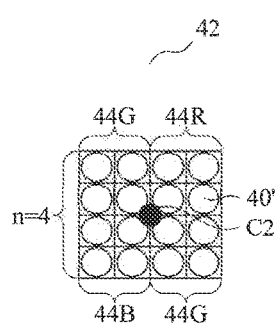
Figure 4C:
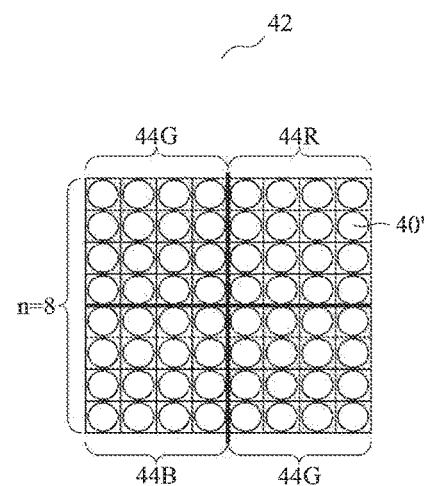

FIGS. 4A-4C illustrate top plan views of some color filter matrixes 42 of a color filter array 40 in accordance with an embodiment. In some embodiments, each color filter matrix 42 includes 2×2 (four) color filter units 44 (see also, FIG. 3), and each color filter unit 44 includes (n/2)×(n/2) color filters 40' of a same color. In some embodiments, the color of the color filter unit 44 is selected from red, blue, and green.

In FIG. 4A, n=2, each color filter matrix 42 includes 2×2 color filter units 44 (such as 44G, 44R, 44B, and 44G), and each color filter unit 44 includes one (i.e., 2/2×2/2) color filter 40' of a same color that is selected from red, blue, and green. For example, a green color filter unit 44R includes a single one green color filter 40'.

In FIG. 4B. n=4, each color filter matrix 42 includes 2×2 color filter units 44 (such as 44G, 44R, 44B, and 44G), and each color filter unit 44 includes 4 (2×2) (i.e., 4/2×4/2) color filters 40' of a same color that is selected from red, blue, and green. For example, a red color filter unit 44R includes 4 red color filters 40'.

In FIG. 4C, n=8, each color filter matrix 42 includes 2×2 color filter units 44 (such as 44G, 44R, 44B, and 44G), and each color filter unit 44 includes 16 (4×4) (i.e., 8/2×8/2)

color filters 40' of a same color that is selected from red, blue, and green. For example, a red color filter unit 44R includes 16 red color filters 40'. When n is greater, an image dynamic range increases, and when n is smaller, an image resolution increases.

As set forth above, a CMOS image sensor 100 includes a plurality of unit pixels 105, each unit pixel 105 including a photodiode 20' surrounded by a second isolation structure 160, a color filter 40' disposed over the photodiode 20', and a micro-lens 60' disposed over the color filter 40', as shown in FIG. 1A.

The CMOS image sensor 100 includes a plurality of matrixes 115 of unit pixels 105, each matrix 115 including an n×n matrix of unit pixels 105, where n is an even integer. The n×n matrix 115 of unit pixels 105 includes an n×n matrix 42 of color filters 40' and an n×n matrix 22 of photodiodes 20' underlying the n×n matrix 42 of color filters 40'.

Also referring to FIGS. 4A-4C, a 2×2 matrix of color filter regions 44 covers the n×n matrix 115 of unit pixels 105. Each region 44 of the 2×2 matrix of color filter regions 44 is composed of a (n/2)×(n/2) matrix of color filters having a same color. Referring to FIG. 4C, for example, each region 44 (e.g., 44R, 44B, or 44G) of the 2×2 matrix of color filter regions 44 is composed of a 4×4 matrix of color filters 40' having a same color (e.g., red, blue, or green).

Figure 5A:
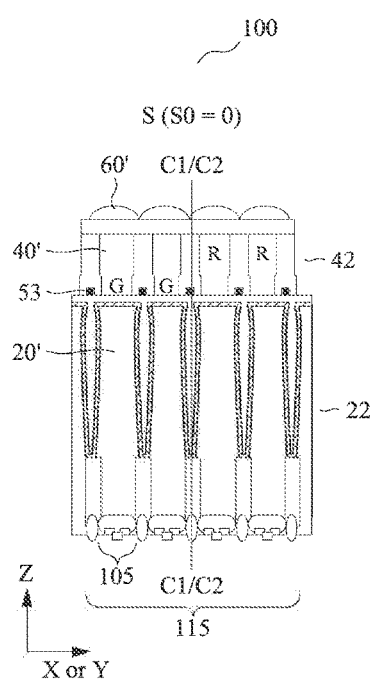
FIGS. 5A, 5B and 5C are cross sectional views illustrating "global shifts" of color filter matrixes of a CMOS image sensor in accordance with an embodiment.
Figure 5B:
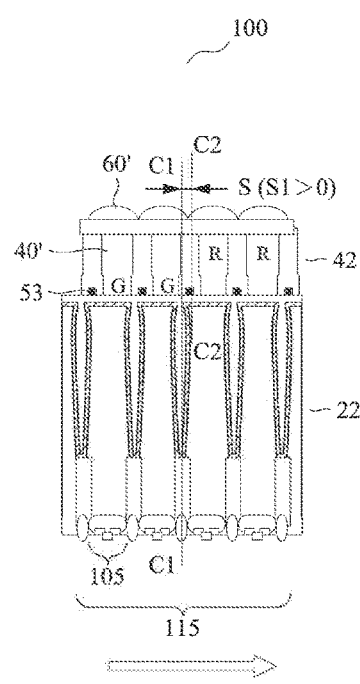
Figure 5C:
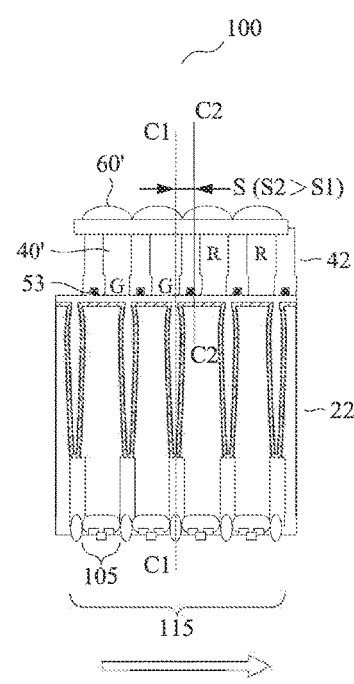

FIGS. 5A-5C are cross sectional views illustrating "global shifts" of color filter matrixes 42 (such as 42A, 42B, and 42C as shown in FIG. 3) of a CMOS image sensor 100, where n=4, in accordance with an embodiment. FIGS. 5A-5C show cross sectional views showing two green color pixels (a green color filter unit 44G) and two red color pixels (a red color filter unit 44R).

A "global shift" means that a color filter matrix 42 (as shown in FIGS. 4A-4C) including a plurality of color filters 40' makes a horizontal shift (or a horizontal offset) as a whole in a particular horizontal direction relative to a photodiode matrix including corresponding photodiodes 20' underlying the plurality of color filters 40'.

In some embodiments, also referring to FIG. 3, the color filter matrixes 42 do not make any global shifts in the center region 45 of the entire color filter array 40. However, the color filter matrixes 42 make global shifts in any edge regions 47 of the color filter array 40. In some embodiments, in an edge region 47 (e.g., a right region) beyond the center region 45 of the entire color filter array 40, the color filter matrixes 42 make global shifts by gradually increased shift amount in a first horizontal direction from a center 45C of the center region 45 to an edge 47E of the edge region 47.

As shown in FIGS. 5A-5C, segments of the metal grid 53 of the first isolation structure 150 defines spaces and locations of color filters 40' of the color filter matrixes 42, and thus defines the horizontal global shifts of the color filter matrixes 42 in the entire color filter array 40 in the color filter layer 140.

In FIGS. 5A-5C, a vertical center line C1-C1 represents a center (or a center of gravity) of a n×n matrix 115 of the photodiodes 20'. A vertical center line C2-C2 represents a center (or a center of gravity) of a n×n matrix 42 (color filter matrix) of color filters 40'. The vertical center line C2-C2 corresponds to a center (of gravity) of the 2×2 matrix of color filter units 44 of the n×n matrix 42 of color filters 40' as shown in FIG. 4B.

Referring to FIG. 5A and FIG. 3, in a center region 45 of the color filter array 40 of the CMOS image sensor 100, no global shift is made to color filter matrixes 42 relative to the unit pixel matrixes 115. A distance S0 between the vertical center lines C1-C1 and C2-C2 is zero (S0=0).

Referring to FIG. 5B and FIG. 3, in an edge region 47 (such as a right edge region) of the color filter array 40 of the CMOS image sensor 100, a color filter matrix 42 located in the right edge region 47 makes a first global shift with a first global shift amount S1 to the right (e.g., +X) in a horizontal X direction in plan view as shown in FIG. 3 with respect to the photodiode grid underlying the color filter matrix 42. A first distance S1 between the center lines C1-C1 and C2-C2 is greater than zero (S1>0). Similarly, in some embodiments, a color filter matrix 42 located in the left edge region 47 makes a first global shift with a first global shift amount S1 to the left (e.g., −X) in a horizontal X direction in plan view as shown in FIG. 3 with respect to the photodiode grid. In some embodiments, a color filter matrix 42 located in the upper or lower edge region and more far away from the center region 45 makes a global shift with a global shift amount to the upper (e.g., +Y) or lower (e.g., −Y) in a vertical Y direction in plan view as shown in FIG. 3 with respect to the photodiode grid. The global shift amount Sv in the Y vertical direction is the same as or different from the global shift amount S1 in the horizontal X direction in plan view. When the size of the CMOS image sensor 100 is a:b (e.g., 4:3, or 16:9), where a is horizontal (X) size and b is vertical (Y) size, S1:Sv equals to a:b at the edge of the image sensor in some embodiments.

Referring to FIG. 5C and FIG. 3, in the edge region 47 (such as a right edge region) of the color filter array 40 of the CMOS image sensor 100, a color filter matrix 42 located in the right edge region 47 and more far away from the center region 45 makes a second global shift with a second global shift amount S2 to the right (e.g., +X) in the horizontal X direction (to the right) in plan view as shown in FIG. 3 with respect to the photodiode grid. A second distance S2 between the center lines C1-C1 and C2-C2 is greater than S1 (S2>S1). In some embodiments, similarly, a color filter matrix 42 located in the left edge region 47 and more far away from the center region 45 makes a second global shift with a second global shift amount S2 to the left (e.g., −X) in a horizontal X direction (to the left) in plan view as shown in FIG. 3 with respect to the photodiode grid.

Below is an example of global shift amounts made by the color filter matrixes 42 in a first direction from a center region 45 to an edge 47E of an edge region (e.g., a right region) of the edge regions of a CMOS image sensor 100 with reference to FIG. 3. In the center region 45, no global shift is made to color filter matrixes 42 relative to the unit pixel matrixes 115 underlying thereof. Beyond the center region 45, in the first direction from the center region 45 to the edge 47E, regarding a first color filter matrix 42, an initial or starting global shift amount to the first color filter matrix 42 is 0.01 nm; regarding the second color filter matrix 42 following the initial color filter matrix 42, the global shift amount is increased by an increasing shift amount 0.01 nm, and thus the global shift amount of the second color filter matrix 42 is 2×0.01 nm (0.01 nm+0.01 nm); regarding the third color filter matrix 42 following the second color filter matrix 42, the global shift amount is further increased by the increasing shift amount 0.01 nm, and thus the global shift amount of the third color filter matrix 42 is 3×0.01 nm (0.01 nm+0.01 nm+0.01 nm); for the $N^{th}$ color filter matrix 42 following the N−$1^{th}$ color filter matrix 42, the global shift amount is further increased by the increasing shift amount 0.01 nm, and thus the global shift amount of the $N^{th}$ color filter matrix 42 is N×0.01 nm. The CMOS image sensor 100 may include e.g., 200,000,000 pixels in total. The increasing global shift amount per color filter matrix is 0.01 nm in this example, but is not limited to 0.01 nm. In some embodiments, the increasing global shift amount per color filter matrix is in a range from about 0.008 nm to about 0.5 nm, from about 0.01 nm to about 0.1 nm or from 0.02 nm to about 0.05 nm, depending on the design and/or process requirements.

In some embodiments, in an edge region 47 of the color filter array 40 of the CMOS image sensor 100, a distance (S such as S1 or S2) between a center (C2-C2) of gravity of the 2×2 matrix of color filter regions 44 and a center (C1-C1) of gravity of the n×n matrix 115 of unit pixels 105 in plan view varies depending on the location of the matrix 115 in the CMOS image sensor 100. The edge 47E of the edge region 47 can be any edge (such as right, left, up, or down edges) in the CMOS image sensor 100.

In some embodiments, referring to FIG. 3 and FIGS. 5B-5C, in the edge region 47, a distance (S) between a center (C2-C2) of gravity of the 2×2 matrix of color filter regions 44 and a center (C1-C1) of gravity of the n×n matrix 115 of unit pixels 105 in plan view gradually increases in a first direction from a center 45C of the center region 45 to an edge 47E of the edge region 47 in the CMOS image sensor 100. In other words, in the edge region 47, global shift amount of the n×n matrix 42 of color filters 40' relative to the n×n matrixes 115 of unit pixels 105 in plan view gradually increases in the first direction from the center 45C of the center region 45 to the edge 47E of the edge region 47.

Figure 5D:
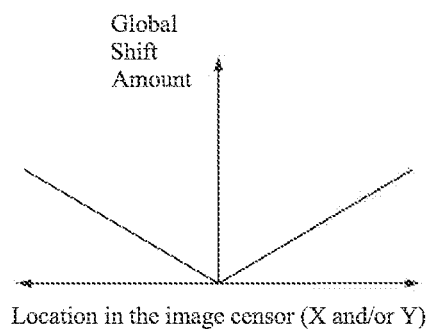
FIGS. 5D, 5E and 5F are coordinate graphs illustrating different ways in which the global shift amount varies in accordance with an embodiment.
Figure 5E:
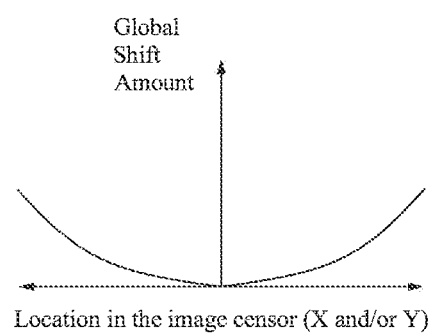
Figure 5F:
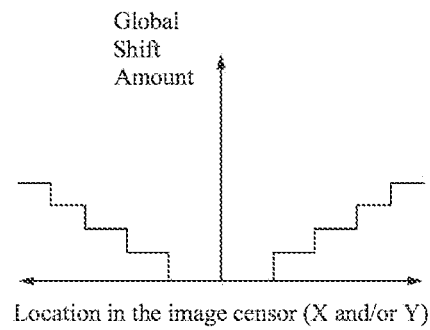

FIGS. 5D, 5E and 5F are coordinate graphs illustrating different ways in which the global shift amount varies in accordance with an embodiment. In some embodiments, as shown in FIG. 5D, the shift amount S linearly increases in a direction (X or Y) in plan view from the center 45C to an edge 47E of the edges as shown in FIG. 3. In some embodiments, as shown in FIG. 5E, the shift amount S non-linearly increases (such as slowly and gradually increasing) from the center 45C to the edge 47E of the edges as shown in FIG. 3. In some embodiments, as shown in FIG. 5F, the shift amount S increases in a step-wise manner from the center 45C to the edge 47E of the edges as shown in FIG. 3A, thereby the global shift amount S increasing by a fixed shift amount (e.g., 1 nm) in each step from a group of fixed number (e.g., 5) of color filter matrixes 42 to a following group of fixed number (e.g., 5) of color filter matrixes 42 in the direction from the center 45C to an edge 47E. Any combination of FIGS. 5D-5F is possible. The direction of the global shift is along a horizontal direction and/or a vertical direction of the image sensor in plan view.

In some embodiments, the maximin shift amount at the edge of the color filter array is in a range from about 50 nm to about 300 nm.

In some embodiments, sizes of the n×n matrix 42 of color filters 40' of the matrixes 115 of unit pixels 105 in plan view in the color filter layer 140 vary depending on locations of the matrixes 115 in the CMOS image sensor 100. In some embodiments, the sizes of the n×n matrix 42 of color filters 40' of the matrixes 115 of unit pixels 105 in plan view gradually decrease in the first direction from the center 45C of the center region 45 to the edge 47E of the edge region 47. In other embodiments, sizes of the n×n matrix 42 of color filters 40' of the matrixes 115 of unit pixels 105 in plan view gradually increase in the first direction from the center 45C of the center region 45 to the edge 47E of the edge region 47.

Advantageously, the global shifts (e.g., as shown in FIGS. 5B and 5C) made to the matrixes of color filters 40' of the matrixes 115 of unit pixels 105 in edge portions 47 beyond the center portion in plan view of the color filter layer 140 (as shown in FIG. 3) increase incident light amount reaching the photodiodes 20' (as shown in FIG. 1A) underlying the matrixes of color filters 40', thereby compensating reduced incident light reaching the photodiodes 20' underlying the matrixes of color filters 40' in edge regions due to the narrow channel width of the pixels 105 and increased incident light angles in the edge portions. Thus, the global shifts can reduce performance non-uniformity of the pixel image array of the CMOS image sensor.

Figure 6:
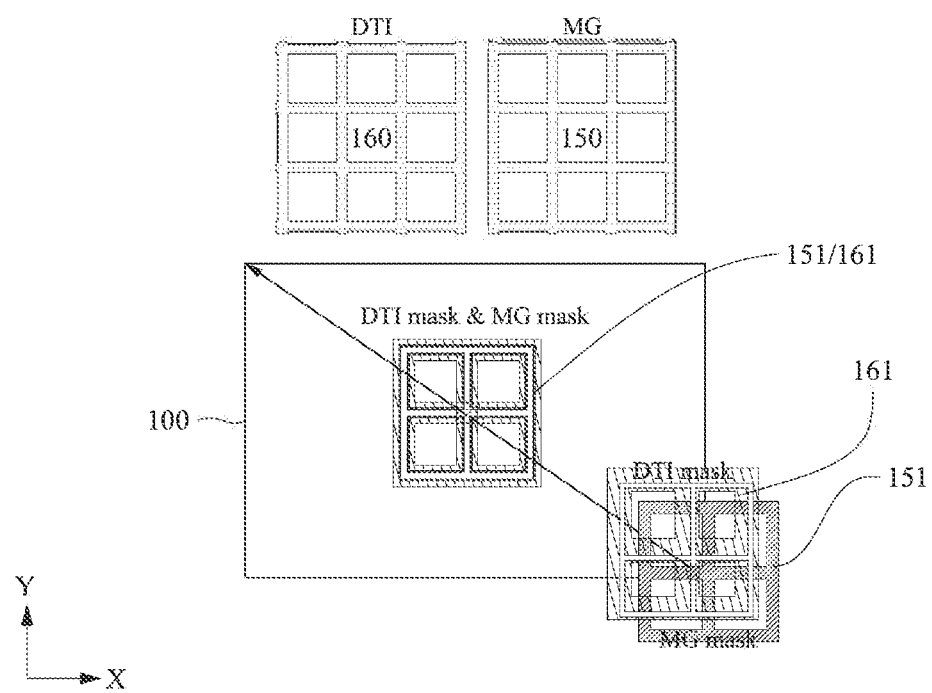
FIG. 6 illustrates a top plan view of a first photo mask for a first isolation structure and a second photo mask for a second isolation structure with respect to an upper surface of a CMOS image sensor.

In some embodiments, the first isolation structure 150 and the second isolation structure 160 as shown in FIG. 1A are manufactured by using one or more lithography and etching operations, using a first photo mask 151 for the first isolation structure 150 and a second photo mask 161 for the second isolation structure 160. FIG. 6 illustrates a top plan view of a part of the first photo mask 151 for the first isolation structure 150 and a part of the second photo mask 161 for the second isolation structure 160 relative to a top surface of a CMOS image sensor 100 in accordance with an embodiment. The first isolation structure 150 as shown in FIGS. 1A and 2A-2E may include a metal grid 53. The second isolation structure 160 as shown in FIG. 1A may include a DTI structure. Each of the first photo mask and the second photo mask includes layout patterns corresponding to a plurality of color filter and photodiode matrixes. As shown in FIG. 6, in a center portion of the top surface of the CMOS image sensor 100, the matrix pattern of the first photo mask 151 for the first isolation structure (and the metal grid) and the matrix pattern of the second photo mask 161 for the DTI align with each other with no shift. In an edge portion away from the center portion, the matrix pattern of the first photo mask 151 is more and more offset from the matrix pattern of the second photo mask 161, in other words, the matrix pattern of the first photo mask 151 shifts more relative to the matrix pattern of the second photo mask 161. In this way, global shifts of the color filter matrixes can be made.

Figure 7:
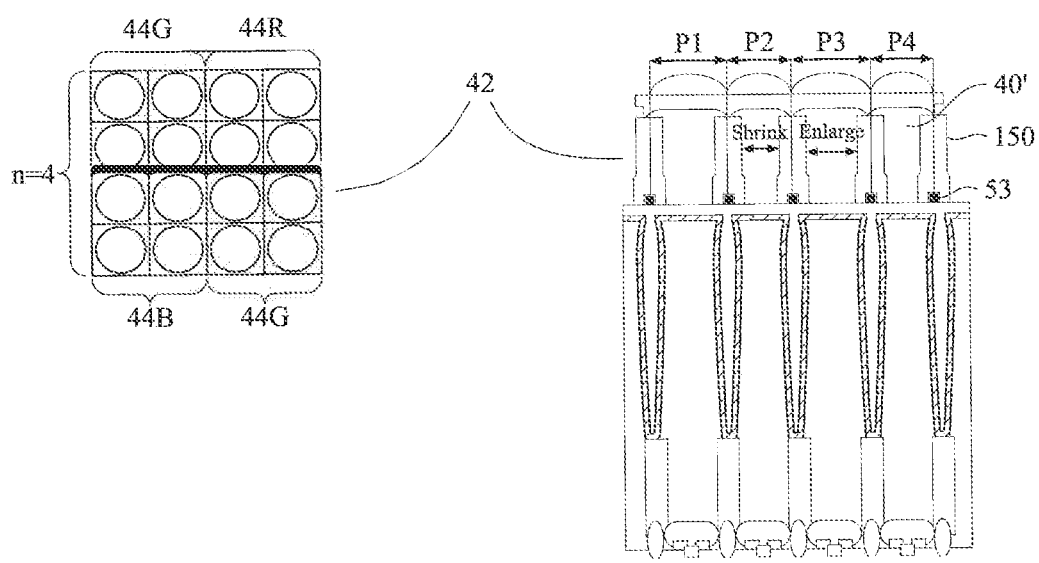
FIG. 7 is a cross sectional view illustrating "inner shifts" of color filters within a color filter matrix of a CMOS image sensor in accordance with an embodiment.

FIG. 7 is a cross sectional view illustrating "inner shifts" of color filters 40' within a 4×4 color filter matrix 42 as shown in e.g., FIGS. 4A-4C of a CMOS image sensor 100 in accordance with an embodiment. The first insolation structure 150 includes a metal grid 53 that defines sizes or pitches (such as P1, P2, P3, and P4) of the color filters 40' within a 4×4 color filter matrix 42 as shown in FIG. 7. Accordance with an embodiment, sizes or pitches of the color filters 40' in a n×n (e.g., n=4) color filter matrix 42 vary depending on locations of the color filters 40' within and relative to the n×n color filter matrix 42 (more details will be explained as follows).

Figure 8A:
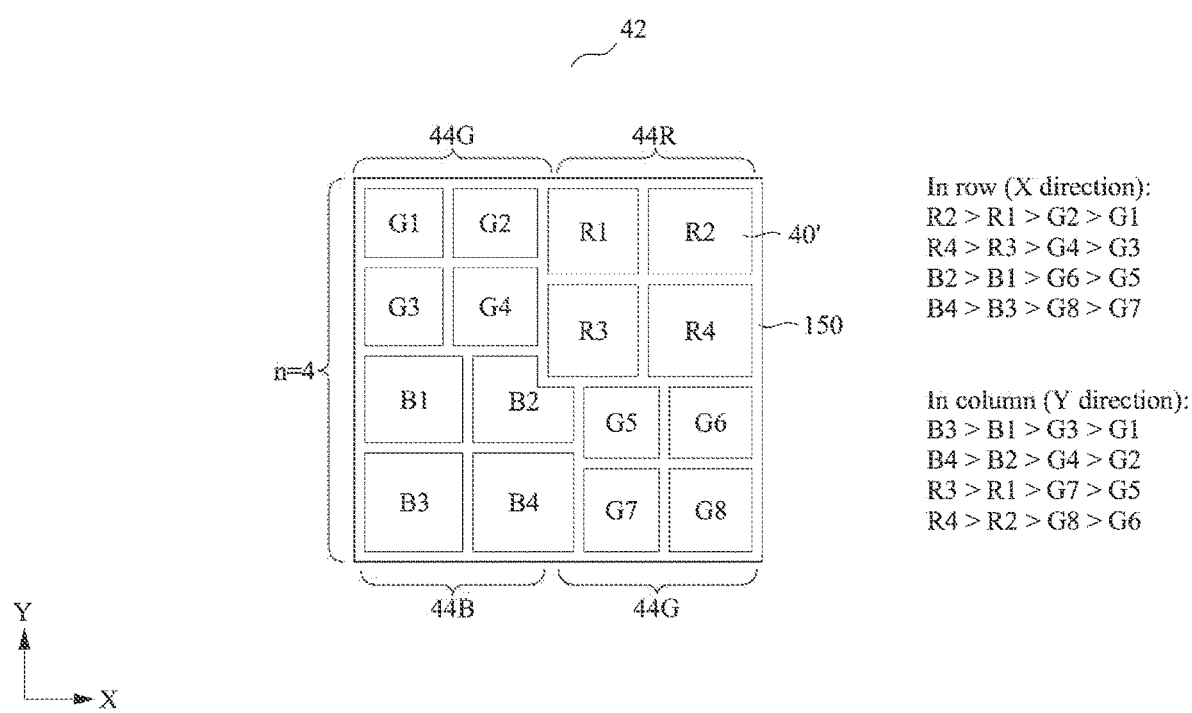
FIGS. 8A, 8B and 8C are top plan views illustrating size or pitch changes (or rankings) of color filters within a color filter matrix as a result of "inner shifts" in accordance with an embodiment.
Figure 8B:
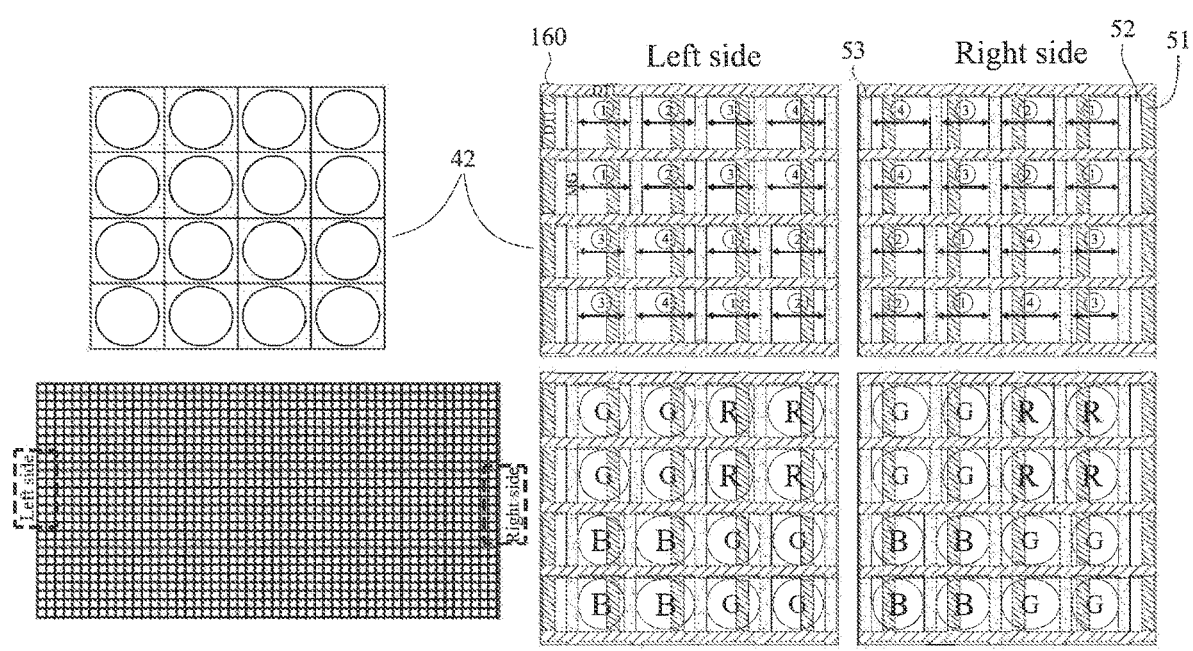
Figure 8C:
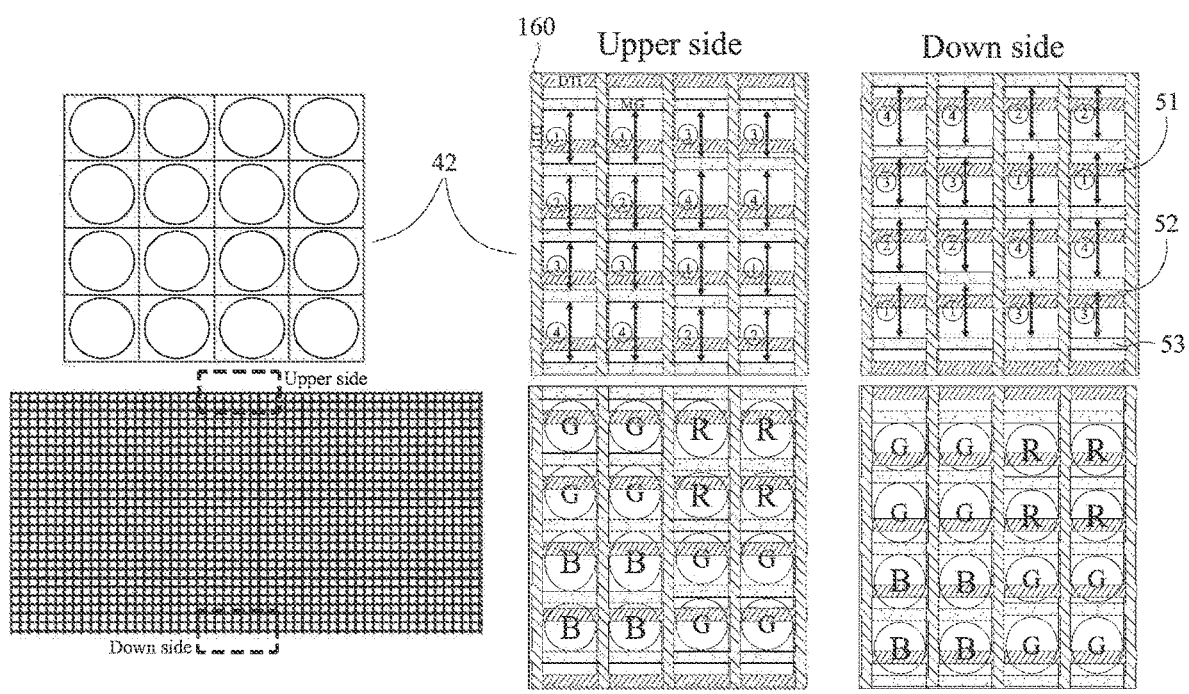

FIGS. 8A, 8B and 8C are top plan views illustrating, as a result of inner shifts, size or pitch changes of color filters within a n×n (e.g., 4×4) color filter matrix 42 in accordance with an embodiment. Each n×n color filter matrix 42 includes 2×2 matrixes of color filter regions 44 (or color filter units 44) of three different colors (such as red, blue, and green). For example, each n×n color filter matrix 42 includes one red filter region, one blue filter region, and two green filter regions. The color filter matrix 42 horizontally extends in plan in a row direction x and in a column y direction. Boundaries of color filters 40' are defined by the first isolation structure 150 (such as the metal grid 53) as shown in FIG. 7.

In some embodiments, sizes and/or pitches of color filters 40' within every n×n color filter matrix 42 vary or change following the same rule or pattern and depending on locations of the color filters 40' within the n×n color filter matrix 42 of the CMOS image sensor 100 (see FIGS. 8A, 8B and 8C). In some embodiments, as a result of inner shifts, a size or pitch of a red or blue color filter 40' is greater than a size of a green color filter 40' in each series (such as in each row or in a column) of color filters 40' of the n×n color filter matrix 42. In some embodiments, as a result of inner shifts, a size or pitch of a color filter (e.g., R2) after another color filter cell (e.g., R1) of the same color is larger than the size of the other color filter (e.g., R1) in each series (such as in each row or in a column) of color filters 40' of the n×n color filter matrix in a first direction in plan view from a center to an edge of the CMOS image sensor. The first direction can be any of the directions in plan such as to the right, left, up, or down directions.

In short, in each row or column of a n×n color filter matrix, for a first color filter and a second color filter after the first color filter have the same color, the second color filter is larger than the first color filter. In each row or column of a n×n color filter matrix, a red color filter is larger than a green color filter, and a blue color filter is larger than a green color filter.

As shown in FIG. 8A, in a direction from left to right, in the first row of color filter matrix 42, G1<G2, R1<R2, (R>G); in the second row of color filter matrix 42, G3<G4, R3<R4, (R>G); in the third row of color filter matrix 42, B1<B2, G5<G6, (B>G); and in the fourth row of color filter matrix 42, B3<B4, G7<G8, (B>G), for example. Here, G1 and G2 respectively represent sizes of a first and a second green color filters, and R1 and R2 respectively represent sizes of a first and a second red color filters in a first row of the color filter matrix 42, for example. Accordingly, as shown in FIG. 8A, in the direction from left to right, in each row of color filters 40' in each color filter matrix 42, the color filters 40' are ranked in an order from larger to smaller, for example: R2>R1>G2>G1; R4>R3>G4>G3; B2>B1>G6>G5; and B4>B3>G8>G7.

Similarly, as shown in FIG. 8A, in a direction from upper to down, in the first column of color filter matrix 42, G1<G3, B1<B3, (B>G); in the second column of color filter matrix 42, G2<G4, B2<B4, (B>G); in the third column of color filter matrix 42, R1<R3, G5<G7, (R>G); and in the fourth row of color filter matrix 42, R2<R4, G6<G8, (R>G), for example. Here, G1 and G3 respectively represent sizes of a first and a second green color filters, and B1 and B3 respectively represent sizes of a first and a second blue color filters in a first column of the color filter matrix 42, for example. Accordingly, as shown in FIG. 8A, in the direction from upper to down, in each column of color filters 40' in each color filter matrix 42, the color filters 40' are ranked in an order from larger to smaller, for example: B3>B1>G3>G1; B4>B2>G4>G2; R3>R1>G7>G5; and R4>R2>G8>G6.

In some embodiments, the arrangements of the inner shift in a color filter matrix are common to all color filters within the color filter matrix. In other embodiments, the arrangements of the inner shift in a color filter matrix vary depending on the locations of the color filter matrixes within the color filter. That is, in addition to the aforementioned common inner shift, each color filter in a color filter matrix makes an extra inner shift depending on a location of the color filter matrix in the entire color filter array. Referring to e.g., FIG. 3, at an edge region 47, in a first direction from a center region 45 to the right edge region 47, a second color filter matrix 42B is after or follows a first color filter matrix 42A. In addition to the aforementioned common inner shift, each color filter (e.g., G1) in the second color filter matrix 42B makes an extra inner shift compared to a corresponding color filter (e.g., G1) in the first color filter matrix 42A. The extra inner shift can lead to an extra size change (either enlarging or shrinking) to each color filter within each color filter matrix, which can result in a size change to the color filter matrix (i.e., a global shift) as aforementioned.

In some embodiments, referring to FIG. 8B, the arrangements of the inner shift in a color filter matrix are common to the color filter matrixes located on one side (e.g., left side) with respect to the vertical center line of the color filter, and the arrangements of the inner shift in a color filter matrix for the color filter matrixes located on the other side (e.g., right) has a mirror arrangement or an identical arrangement to the left side arrangement. In some embodiments, referring to FIG. 8C, the arrangements of the inner shift in a color filter matrix are common to the color filter matrixes located on upper side with respect to the horizontal center line of the color filter, and the arrangements of the inner shift in a color filter matrix for the color filter matrixes located on the lower side has a mirror arrangement or an identical arrangement to the upper side arrangement.

Figure 9:
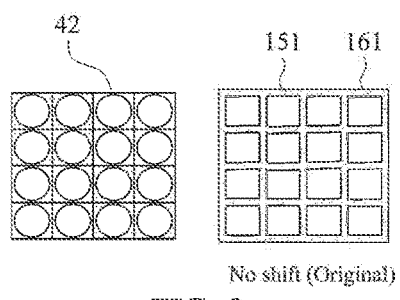
FIG. 9 illustrates no shifts made to wall patterns of a first isolation structure relative to wall patterns of a second isolation structure.
Figure 10:
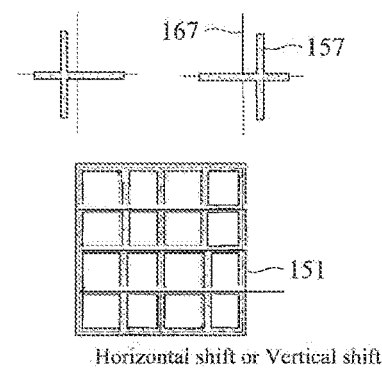
FIG. 10 illustrates various shifts made to wall patterns of a first isolation structure relative to wall patterns of a second isolation structure.
Figure 10:
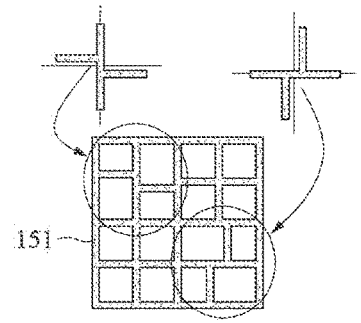

FIGS. 9 and 10 show a first photo mask 151 for making wall patterns 157 of a first isolation grid (such as the metal grid 53) 150 and a second photo mask 161 for making wall patterns 167 for a second isolation grid 160 (such as the DTI). In some embodiments, inner shifts to the color filters 40' within a color filter matrix 42 are made by adjusting or shifting wall patterns 157 of the metal grid 53 relative to wall patterns 167 of the DTI so that sizes or pitches of the color filters 40' on both sides of the wall patterns 157 within the color filter matrix 42 are changed. FIG. 9 illustrates that no shift occurs to wall patterns made by the first photo mask 151 relative to wall patterns made by the second photo mask 161. FIG. 10 illustrates various shifts that occur to wall patterns 157 of the metal grid 53 of the first isolation grid 150 relative to wall patterns 167 of the DTI grid of the second isolation grid 160, thus causing inner shifts and/or global shifts. For example, the various wall pattern shifts can result in various inner shifts or offsets of color filters 40' relative to the photodiodes 20' of the unit pixels 105. The various reticle shifts can also result in global shifts of color filter matrixes 42 relative to photodiode matrixes 22 of the unit pixel matrixes 115.

Figure 11A:
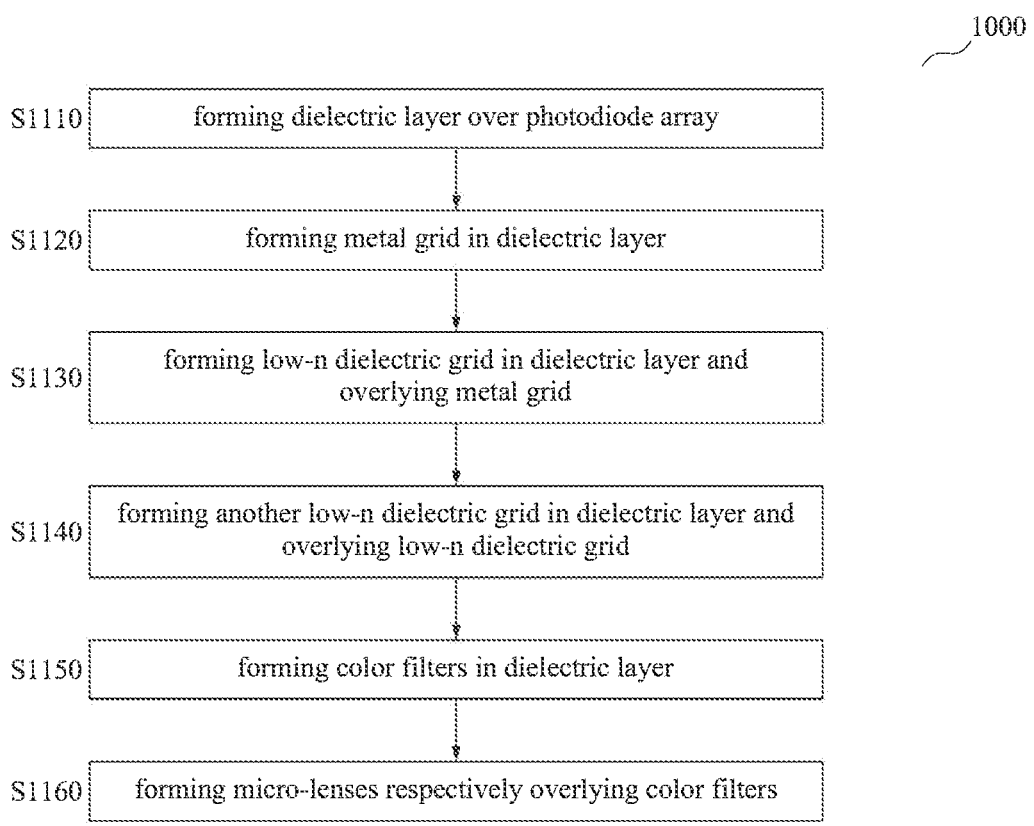
FIG. 11A is a flow chart showing a process of manufacturing a CMOS image sensor shown in FIG. 1A accordance with an embodiment.

FIG. 11A is a flow chart showing a process 1100 of manufacturing a CMOS image sensor 100 accordance with an embodiment. As aforementioned, as shown in FIG. 1A, a CMOS image sensor 100 includes a photodiode array 20 disposed in a semiconductor substrate 110, a color filter array 40 disposed over and substantially aligning with the photodiode array 20, a first isolation structure 150 to laterally separate adjacent color filters 40' of the color filter array 40, and a micro-lens array 60 disposed over and aligning with the color filter array 40. As shown in FIG. 2A, the first isolation structure 150 includes a first low-n dielectric grid 51, a second low-n dielectric grid 52 underlying the first low-n dielectric grid 51, and a metal grid 53 at least partially enclosed by the second low-n dielectric grid 52.

FIGS. 11B, 11C, 11D, 11E, 11F, 11G, 11H, 11I, 11J, 11K, 11L and 11M are cross sectional views illustrating the manufacturing process in FIG. 11A accordance with an embodiment.

Figure 11B:
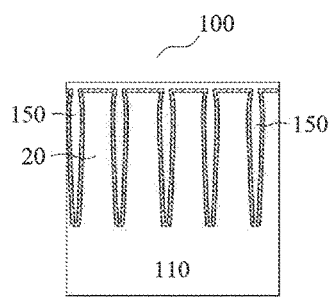
FIGS. 11B, 11C, 11D, 11E, 11F, 11G, 11H, 11I, 11J, 11K, 11L and 11M are cross sectional views illustrating the manufacturing process in FIG. 11A accordance with an embodiment.

Referring to FIG. 11B, the CMOS image sensor 100 includes a photodiode array 20 that is formed and positioned in a semiconductor substrate 110. The CMOS image sensor 100 includes a DTI grid 150 to laterally separate adjacent photodiodes of the photodiode array 20 in the semiconductor substrate 110.

Figure 11C:
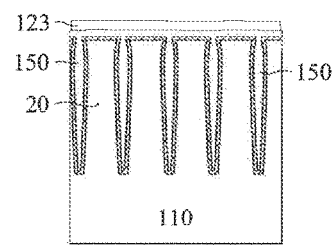

Referring to FIG. 11A and FIG. 11C, in step 1110, a dielectric layer 123 is formed over the photodiode array 20.

The forming method of the dielectric layer 123 can be chemical vapor deposition or spin coating, for example.

Figure 11D:
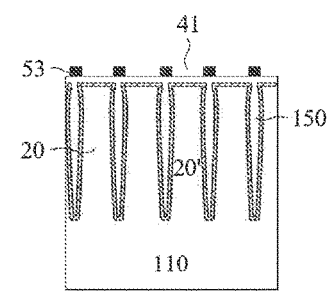
Figure 11E:
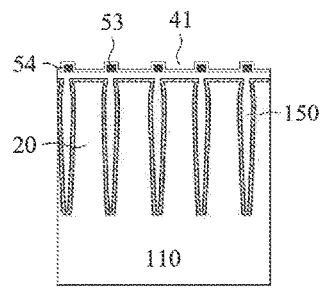
Figure 11F:
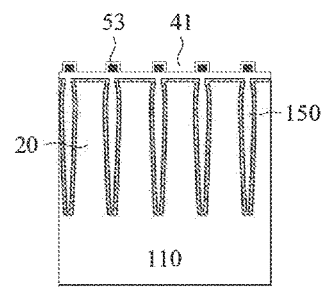

Referring to FIG. 11A and FIG. 11D, in step 1120, a metal grid 53 is formed in the dielectric layer 123 and defines a plurality of openings 41. The plurality of openings 41 are positioned to align with corresponding photodiodes 20' of the photodiode array 20. In some embodiments, one or more photo masks are used to pattern the metal grid 53 in a photolithography process such that inner shifts will be made to the later formed color filters 40'. In some embodiments, an etch stop film 54 is formed over the metal grid 53 and the semiconductor substrate 110 as shown in FIG. 11E, and the etch stop film 54 over the semiconductor substrate 110 is then etched as shown in FIG. 11F. The formation method of metal grid 53 can be performed by deposition, photolithography, and/or etching, for example.

Figure 11G:
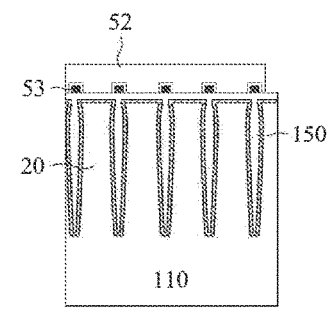
Figure 11H:
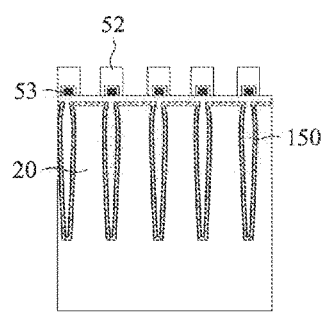

Referring to FIG. 11A and FIGS. 11G and 11H, in step 1130, a low-n dielectric grid 52 is formed in the dielectric layer 123 and overlying the metal grid 53. In some embodiments, the low-n dielectric grid 52 at least partially wraps the metal grid 53. The formation method of the low-n dielectric grid 52 can be performed by deposition, photolithography, and/or etching, for example.

Figure 11I:
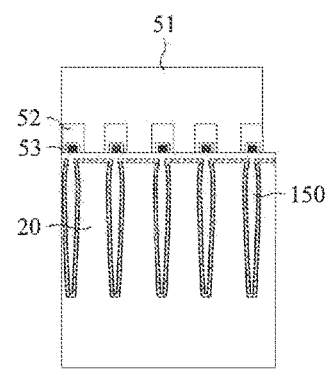
Figure 11J:
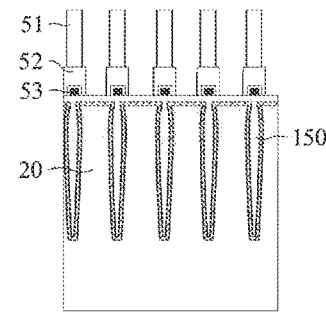

Referring to FIG. 11A and FIGS. 11I and 11J, in step 1140, another low-n dielectric grid 51 is formed in the dielectric layer 123 and overlying the low-n dielectric grid 52. In some embodiments, a width W1 of the other low-n dielectric grid 51 is less than a width W2 of the low-n dielectric grid 52. (Also referring to FIG. 2A). The formation method of the other low-n dielectric grid 52 can be performed by deposition, photolithography, and/or etching, for example.

Figure 11K:
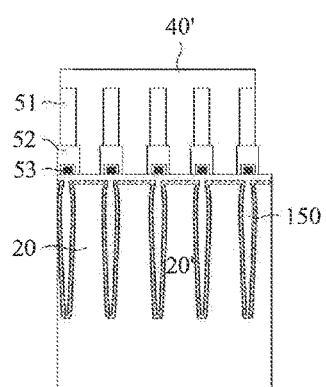
Figure 11L:
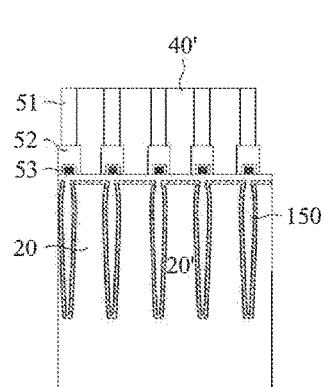

Referring to FIG. 11A and FIGS. 11K and 11L, in step 1150, a plurality of color filters 40' are formed on the dielectric layer 123 by filling the plurality of openings 41 with a color filter material. The plurality of color filters 40' substantially align with the corresponding photodiodes 20' underlying the plurality of color filters 40'. The formation method of the color filter 40' can be performed by deposition, photolithography, spin coating, and/or etching, for example.

Figure 11M:
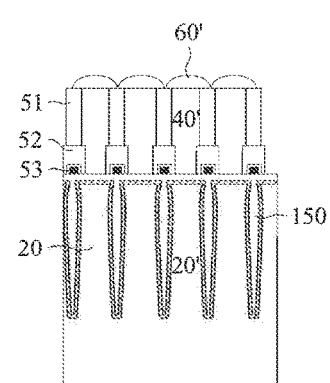

Referring to FIG. 11A and FIG. 11M, in step 1160, a plurality of micro-lenses 60' are formed respectively overlying the plurality of color filters 40'. The micro-lenses 60' can be made from a transparent material having a refractive index greater than the refractive index of the color filters 40' and smaller than the refractive index of the dielectric layer 123. For examples, the transparent material can be made by glass, or a transparent polymer.

In some embodiments, the dielectric layer 123 is made from a dielectric material having a dielectric constant greater than or equal to silicon oxide.

In some embodiments, refractive indexes of the low-n dielectric grid 52 and the other low-n dielectric grid 51 are less than a refractive index of the plurality of color filters 40'. In some embodiments, refractive indexes of the low-n dielectric grid 52 and the other low-n dielectric grid 51 are in a range greater than 1 and less than about 1.5.

In some embodiments, the metal grid 53 is made of a metal material or a metal alloy material. In some embodiments, the metal material of the metal grid 53 includes W, Al, Cu or Cr. In some embodiments, the metal alloy material of the metal grid 53 includes, but not limited to, TiN. In some embodiments, a dielectric etch stop film 54 is formed around the metal grid 53 to separate the metal grid 53 from the low-n dielectric grid 52. Thus, the dielectric etch stop film 54 protects the metal grid 53 while the low-n dielectric grid 52 is under an etching process.

According to embodiments of the present disclosure, a composite grid insolation structure includes a first low-n grid, a second low-n grid underlying the first low-n grid, and a metal grid within the second low-n grid, the first low-n grid being narrower than the second low-n grid, and refractive indexes of the first and the second low-n dielectric grids of the first isolation structure being less than a refractive index of the color filter cells. In addition, sizes of color filters in each color filter matrix in a color filter layer vary depending on locations of the color filters in the color filter matrix. Furthermore, in edge portions beyond a center region of the color filter array, color filter matrixes may shift (or offset) from corresponding unit pixel matrixes by a gradually increased shift amount in a direction from a center of the center region to an edge of the edge region. Advantageously, as a result of these, quantum efficiency (QE) and performance uniformity of the pixel image sensors in the CMOS image sensor are improved.

According to embodiments of the present disclosure, a CMOS image sensor includes a photodiode array, a color filter array, a micro-lens array, and a grid isolation structure laterally separating adjacent color filters. The grid isolation structure includes a first low-n grid, a second low-n grid underlying the first low-n grid, and a metal grid within the second low-n grid, the first low-n grid being narrower than the second low-n grid. According to embodiments of the present disclosure, the CMOS image sensor includes a plurality of unit pixels, each of the plurality of unit pixels including a photodiode surrounded by an isolation structure, a color filter disposed over the photodiode, and a micro-lens disposed over the color filter. The CMOS image sensor includes a plurality of matrixes including an n×n matrix of unit pixels. The n×n matrix of unit pixels has an n×n matrix of color filters and an n×n matrix of photodiodes. As a result of global shifts, a distance S (or an offset amount) between a center C2 of the color filter matrixes and a center C1 of the photodiode matrixes in plan view varies depending on locations of the plurality of matrixes in the CMOS image sensor. As a result of inner shifts, a size of a color filter of the n×n matrix of unit pixels varies depending on a location of the color filter in the n×n matrix of unit pixels. In this way, quantum efficiency (QE) and performance uniformity of the plurality of unit pixels of the CMOS image sensor are advantageously improved.

In accordance with an aspect of the present disclosure, a CMOS image sensor includes a photodiode layer including a photodiode array disposed in a semiconductor substrate; a color filter layer including a color filter array disposed over and substantially aligning with the photodiode array; a micro-lens layer including a micro-lens array disposed over and aligning with the color filter array; and a first isolation structure disposed in the color filter layer to laterally separate adjacent color filter cells of the color filter array, and including a first low-n dielectric grid, a second low-n dielectric grid underlying the first low-n dielectric grid, and a metal grid at least partially enclosed by the second low-n dielectric grid. A first width of the first low-n dielectric grid is less than a second width of the second low-n dielectric grid. In one or more of the foregoing and/or following embodiments, refractive indexes of the first and the second low-n dielectric grids of the first isolation structure are less than a refractive index of the color filter cells, and the refractive indexes of the first and the second low-n dielectric grids are in a range greater than 1 and less than 1.5. In one or more of the foregoing and/or following embodiments, the metal grid is at least partially wrapped by a dielectric etch stop film to separate the metal grid from the second low-n dielectric grid, and the metal grid is made of a metal material or a metal alloy material. In one or more of the foregoing and/or following embodiments, the CMOS image sensor further includes a second isolation structure disposed in the semiconductor substrate to laterally separate adjacent photodiodes of the photodiode array in the photodiode layer. In one or more of the foregoing and/or following embodiments, the second isolation structure includes a deep trench isolation grid vertically extending into the photodiode layer from an upper surface of the photodiode layer. In one or more of the foregoing and/or following embodiments, the CMOS image sensor further includes a transfer transistor array disposed in the semiconductor substrate, and a third isolation structure including a shallow trench isolation grid to laterally separate adjacent transfer transistors of the transfer transistor array. In one or more of the foregoing and/or following embodiments, the CMOS image sensor further includes a separation layer separating the micro-lens layer and the color filter layer.

In accordance with an aspect of the present disclosure, a CMOS image sensor includes a plurality of unit pixels, each of the plurality of unit pixels including a photodiode surrounded by an isolation structure, a color filter disposed over the photodiode, and a micro-lens disposed over the color filter. The CMOS image sensor includes a plurality of matrixes, each of the plurality of matrixes includes an n×n matrix of unit pixels, the n×n matrix of unit pixels having an n×n matrix of color filters, where n is an even number, and a 2×2 matrix of color filter regions covering the n×n matrix of unit pixels. Each region of the 2×2 matrix of color filter regions is composed of a (n/2)×(n/2) matrix of color filters having a same color. A distance between a center of gravity of the 2×2 matrix of color filter regions and a center of gravity of the n×n matrix of unit pixels in plan view varies depending on locations of the plurality of matrixes in the CMOS image sensor. A size of at least one color filter of the n×n matrix of unit pixels varies depending on a location of the at least one color filter in the n×n matrix of unit pixels. In one or more of the foregoing and/or following embodiments, in an edge region of the CMOS image sensor, the distance between the center of gravity of the 2×2 matrix of color filter regions and the center of gravity of the n×n matrix of unit pixels gradually increases in a first direction in plan view from a center of the CMOS image sensor to an edge of the edge portion. In one or more of the foregoing and/or following embodiments, sizes of the n×n matrix of color filters of the plurality of matrixes in plan view vary depending on locations of the plurality of matrixes in the CMOS image sensor. In one or more of the foregoing and/or following embodiments, the sizes of the n×n matrix of color filters of the plurality of matrixes in plan view gradually decrease in a first direction in plan view from a center of the CMOS image sensor to an edge of an edge portion. In one or more of the foregoing and/or following embodiments, the 2×2 matrix of color filter regions are of three colors of red, blue, and green, and each n×n matrix of color filters includes one matrix of red filter region, one matrix of blue filter region, and two matrix of green filter regions. In one or more of the foregoing and/or following embodiments, a size of a red or blue color filter is greater than a size of a green color filter in each series of color filters of the n×n matrix of color filters. In one or more of the foregoing and/or following embodiments, a size of a color filter after another color filter cell of the same color is less than the size of the other color filter in each series of color filters of the n×n matrix of color filters in a first direction in plan view from a center of the CMOS image sensor.

In accordance with an aspect of the present disclosure, a method of manufacturing a CMOS image sensor device includes: forming a dielectric layer over a photodiode array, the photodiode array being positioned in a substrate; forming a metal grid in the dielectric layer and defining a plurality of openings positioned to align with corresponding photodiodes of the photodiode array; forming a low-n dielectric grid in the dielectric layer and overlying the metal grid, the low-n dielectric grid at least partially wrapping the metal grid; forming another low-n dielectric grid in the dielectric layer and overlying the low-n dielectric grid, a width of the other low-n dielectric grid being less than a width of the low-n dielectric grid; forming a plurality of color filters by filling the plurality of openings on the dielectric layer, the plurality of color filters are substantially aligned with the corresponding photodiodes; and forming a plurality of micro-lenses respectively overlying the plurality of color filters. In one or more of the foregoing and/or following embodiments, the dielectric layer is made from a dielectric material having a dielectric constant greater than or equal to silicon oxide. In one or more of the foregoing and/or following embodiments, refractive indexes of the low-n dielectric grid and the other low-n dielectric grid are less than a refractive index of the plurality of color filters. In one or more of the foregoing and/or following embodiments, refractive indexes of the low-n dielectric grid (52) and the other low-n dielectric grid (51) are in a range greater than 1 and less than 1.5. In one or more of the foregoing and/or following embodiments, a dielectric etch stop film is formed around the metal grid, and the dielectric etch stop film separates the metal grid from the low-n dielectric grid. In one or more of the foregoing and/or following embodiments, the metal grid is made of a metal material or a metal alloy material. The metal material includes W, Al, Cu or Cr, and the metal alloy material includes TiN.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A CMOS image sensor, comprising:
   a photodiode layer comprising a photodiode array disposed in a semiconductor substrate;
   a color filter layer comprising a color filter array disposed over and substantially aligning with the photodiode array;
   a micro-lens layer comprising a micro-lens array disposed over and aligning with the color filter array; and
   a first isolation structure disposed in the color filter layer to laterally separate adjacent color filter cells of the color filter array, and comprising a first low refractive index (low-n) dielectric grid, a second low-n dielectric grid underlying the first low-n dielectric grid, and a metal grid at least partially enclosed by the second low-n dielectric grid, wherein a first width of the first low-n dielectric grid is less than a second width of the second low-n dielectric grid.

2. The CMOS image sensor of claim 1, wherein refractive indexes of the first and the second low-n dielectric grids of the first isolation structure are less than a refractive index of the color filter cells, and wherein the refractive indexes of the first and the second low-n dielectric grids are in a range greater than 1 and less than 1.5.

3. The CMOS image sensor of claim 1, wherein the metal grid is at least partially wrapped by a dielectric etch stop film to separate the metal grid from the second low-n dielectric grid, and the metal grid is made of a metal material or a metal alloy material.

4. The CMOS image sensor of claim 1, further comprising a second isolation structure disposed in the semiconductor substrate to laterally separate adjacent photodiodes of the photodiode array in the photodiode layer.

5. The CMOS image sensor of claim 4, wherein the second isolation structure comprises a deep trench isolation (DTI) grid vertically extending into the photodiode layer from an upper surface of the photodiode layer.

6. The CMOS image sensor of claim 1, further comprising a transfer transistor array disposed in the semiconductor substrate, and a third isolation structure comprising a shallow trench isolation (STI) grid to laterally separate adjacent transfer transistors of the transfer transistor array.

7. The CMOS image sensor of claim 1, further comprising a separation layer separating the micro-lens layer and the color filter layer.

8. A CMOS image sensor, comprising:
a plurality of unit pixels, each of the plurality of unit pixels including a photodiode surrounded by an isolation structure, a color filter disposed over the photodiode, and a micro-lens disposed over the color filter, wherein:
the CMOS image sensor comprises a plurality of matrixes,
each of the plurality of matrixes comprises an n×n matrix of unit pixels, the n×n matrix of unit pixels having an n×n matrix of color filters, where n is an even number, and a 2×2 matrix of color filter regions covering the n×n matrix of unit pixels,
each region of the 2×2 matrix of color filter regions is composed of a (n/2)×(n/2) matrix of color filters having a same color,
a distance between a center of gravity of the 2×2 matrix of color filter regions and a center of gravity of the n×n matrix of unit pixels in plan view varies depending on locations of the plurality of matrixes in the CMOS image sensor, and
a size of at least one color filter of the n×n matrix of unit pixels varies depending on a location of the at least one color filter in the n×n matrix of unit pixels.

9. The CMOS image sensor of claim 8, wherein in an edge of the CMOS image sensor, the distance between the center of gravity of the 2×2 matrix of color filter regions and the center of gravity of the n×n matrix of unit pixels slowly and gradually increases in a first direction in plan view from a center of the CMOS image sensor to an edge of the edge portion.

10. The CMOS image sensor of claim 8, wherein sizes of the n×n matrix of color filters of the plurality of matrixes in plan view vary depending on locations of the plurality of matrixes in the CMOS image sensor.

11. The CMOS image sensor of claim 10, wherein the sizes of the n×n matrix of color filters of the plurality of matrixes in plan view gradually decrease in a first direction in plan view from a center of the CMOS image sensor to an edge of an edge portion.

12. The CMOS image sensor of claim 8, wherein the 2×2 matrix of color filter regions are of three colors of red, blue, and green, and wherein each of the 2×2 matrix of color filter regions comprises one red filter region, one blue filter region, and two green filter regions.

13. The CMOS image sensor of claim 12, wherein a size of a red or blue color filter is greater than a size of a green color filter along each series of color filters of the n×n matrix of color filters.

14. The CMOS image sensor of claim 12, wherein in the same color filter region, a size of a color filter after another color filter cell is less than a size of the other color filter in each series of color filters of the n×n matrix of color filters.

15. A method of manufacturing a CMOS image sensor device, the method comprising:
forming a dielectric layer over a photodiode array, the photodiode array being positioned in a substrate;
forming a metal grid in the dielectric layer and defining a plurality of openings positioned to align with corresponding photodiodes of the photodiode array;
forming a low refractive index (low-n) dielectric grid in the dielectric layer and overlying the metal grid, the low-n dielectric grid at least partially wrapping the metal grid;
forming another low-n dielectric grid in the dielectric layer and overlying the low-n dielectric grid, wherein a width of the other low-n dielectric grid is less than a width of the low-n dielectric grid;
forming a plurality of color filters by filling the plurality of openings on the dielectric layer, wherein the plurality of color filters is substantially aligned with the corresponding photodiodes; and
forming a plurality of micro-lenses respectively overlying the plurality of color filters.

16. The method of claim 15, wherein the dielectric layer is made from a dielectric material having a dielectric constant greater than or equal to silicon oxide.

17. The method of claim 15, wherein refractive indexes of the low-n dielectric grid and the other low-n dielectric grid are less than a refractive index of the plurality of color filters.

18. The method of claim 15, wherein refractive indexes of the low-n dielectric grid and the other low-n dielectric grid are in a range greater than 1 and less than 1.5.

19. The method of claim 15, further comprising forming a dielectric etch stop film around the metal grid, wherein the dielectric etch stop film separates the metal grid from the low-n dielectric grid.

20. The method of claim 15, wherein the metal grid is made of a metal material or a metal alloy material, wherein the metal material comprises W, Al, Cu or Cr, and wherein the metal alloy material comprises TiN.

* * * * *